United States Patent [19]
Shaik et al.

[11] Patent Number: 5,920,515
[45] Date of Patent: Jul. 6, 1999

[54] REGISTER-BASED REDUNDANCY CIRCUIT AND METHOD FOR BUILT-IN SELF-REPAIR IN A SEMICONDUCTOR MEMORY DEVICE

[75] Inventors: Imtiaz P. Shaik, Fremont; Dennis L. Wendell, Pleasanton; Benjamin S. Wong, Castro Valley; John C. Holst; Donald A. Draper, both of San Jose; Amos Ben-Meir, Cupertino; John G. Favor, Scotts Valley, all of Calif.

[73] Assignee: Advanced Micro Devices, Inc., Sunnyvale, Calif.

[21] Appl. No.: 08/938,062

[22] Filed: Sep. 26, 1997

[51] Int. Cl.[6] .................................................... G11C 7/00
[52] U.S. Cl. .................. 365/200; 365/201; 371/22.5; 371/10.3
[58] Field of Search ................................ 365/201, 200; 371/10.2, 10.3, 22.5

[56] References Cited

U.S. PATENT DOCUMENTS

| | | | |
|---|---|---|---|
| 4,388,705 | 6/1983 | Sheppard | 365/210 |
| 5,563,826 | 10/1996 | Pascucci et al. | 365/185.21 |
| 5,642,308 | 6/1997 | Yoshida | 365/185.12 |
| 5,771,191 | 6/1998 | Matsue | 365/201 X |

*Primary Examiner*—Huan Hoang
*Attorney, Agent, or Firm*—Skjerven, Morrill, MacPherson, Franklin & Friel, L.L.P.

[57] ABSTRACT

A semiconductor memory array with Built-in Self-Repair (BISR) includes redundancy circuits associated with failed row address stores to drive redundant row word lines, thereby obviating the supply and normal decoding of a substitute addresses. NOT comparator logic compares a failed row address generated and stored by BISR circuits to a row address supplied to the memory array. A TRUE comparator configured in parallel with the NOT comparator simultaneously compares defective row address signal to the supplied row address. Since NOT comparison is performed quickly in dynamic logic without setup and hold time constraints, timing impact on a normal (non-redundant) row decode path is negligible, and since TRUE comparison, though potentially slower than NOT comparison, itself identifies a redundant row address and therefore need not employ an N-bit address to selected word-line decode, redundant row addressing is rapid and does not adversely degrade performance of a self-repaired semiconductor memory array. By providing redundancy handling at the predecode circuit level, rather than at a preliminary address substitution stage, access times to a BISR memory array in accordance with the present invention are improved.

22 Claims, 13 Drawing Sheets

| Inputs | | | | | | Current State | Next State | Outputs | | | | | | | |
|---|---|---|---|---|---|---|---|---|---|---|---|---|---|---|---|
| StartBIST | LastAddr | DataInverted | AddrDown | LastDataBkgnd | RedundancyEn | | | NextAddr | InvertData | InvertAddrDir | NextDataBkgnd | BWE | InvertExpData | CompareEn | RedundancyEn |
| NO | — | — | — | — | — | IDLE | IDLE | NO | NO | NO | NO | NO | NO | NO | NO |
| YES | — | — | — | — | — | IDLE | INIT | NO | NO | NO | NO | NO | NO | NO | NO |
| — | NO | — | — | — | — | INIT | INIT | YES | NO | NO | NO | YES | NO | NO | NO |
| — | YES | — | — | — | — | INIT | RDWR | YES | YES | NO | NO | YES | YES | NO | NO |
| — | — | — | — | — | — | RDWR | RD | NO | NO | NO | NO | NO | NO | YES | NO |
| — | NO | — | — | — | — | RD | RDWR | YES | NO | NO | NO | NO | YES | YES | NO |
| — | YES | YES | — | — | — | RD | RDWR | YES | YES | YES | NO | NO | YES | YES | NO |
| — | YES | NO | NO | — | — | RD | RDWR | NO | YES | YES | NO | NO | NO | YES | NO |
| — | YES | NO | YES | — | — | RD | HOLD | NO | NO | NO | YES | NO | NO | NO | NO |
| — | — | — | — | NO | — | HOLD | INIT | NO | NO | NO | YES | NO | NO | NO | YES |
| — | — | — | — | YES | YES | HOLD | INIT | NO | NO | NO | NO | NO | NO | NO | NO |
| — | — | — | — | YES | — | HOLD | END | NO | NO | NO | NO | NO | NO | NO | NO |
| — | — | — | — | — | — | END | END | NO | NO | NO | NO | NO | NO | NO | NO |

FIG. 13

REGISTER-BASED REDUNDANCY CIRCUIT AND METHOD FOR BUILT-IN SELF-REPAIR IN A SEMICONDUCTOR MEMORY DEVICE

BACKGROUND OF THE INVENTION

1. Field of the Invention

The present invention relates to redundancy circuits and methods for built-in self repair of a semiconductor memory device with failed memory elements.

2. Description of the Related Art

Semiconductor memory devices are generally organized in a two-dimensional array, wherein the memory elements are located at the intersection of rows, or "word lines," and columns, or "bit lines," of the array. To access a given memory element, it is necessary to select the word line and the bit line at the intersection of which the memory element is located. For this purpose, memory addresses are divided into row and column address signals, which are decoded independently.

In the manufacture of semiconductor memories, defects are frequently encountered that affect a limited number of memory elements in the memory array. In order to prevent rejection of an entire chip due to the presence of a comparatively small number of defective memory elements, and thereby increase manufacturing process yield, the typical manufacturing technique provides for a certain number of redundant memory elements.

Redundant memory elements have been used as replacements for those elements that, during testing of the memory device, prove defective. Redundancy circuitry typically includes laser programmable fuses or other non-volatile memory elements suitable to store those address configurations corresponding to the defective memory elements. Laser programmable fuses have several disadvantages including requiring significant testing and laser programming manufacturing infrastructure. Furthermore, laser programmable fuses are large compared to feature sizes achievable with typical modem process techniques and, as a result, create layout problems when required on pitch. Laser programmable fuses must be programmed prior to packaging and therefore cannot be used to replace defects that develop during burn-in.

For at least some of these reasons, other non-volatile memory elements such as electrically programmable fuses or floating-gate MOSFETs have been used to store address configurations corresponding to defective memory elements. For example, U.S. Pat. No. 5,313,424 to Adams et al., entitled "Module Level Electronic Redundancy" and issued May 17, 1994, discloses an array built-in self-test (ABIST) system in which electrically programmable fuses can be programmed after packaging to encode faulty cell addresses.

Another built-in self-test (BIST) and built-in self-repair (BISR) design is disclosed by T. Chen et al., "A Self-Testing and Self-Repairing Structure for Ultra-Large Capacity Memories," in Proc. IEEE ITC 1992, pp. 623–631. Self-testing is performed by a 13N algorithm. During self-testing, an address generated by an address generator is supplied to an address decoder which in turn addresses into a memory array. Test patterns are generated by a data generator and data are written to and read from the memory array under control of a state machine. A comparator compares data read from the array with data generated by the data generator and, if a fault is detected, latches the faulty address into a fault signature block. During memory access operations, the faulty addresses stored in the fault signature block are used to divert (or redirect) an access to a faulty address to a non-faulty redundant address. A memory access address is compared to contents of the fault signature block and, if a match occurs, the access is redirected to a redundant address. Redirection is provided by an address correction block which supplies a corrected address to the address decoder which in turn addresses into a memory array. Chen's approach provides a flexible address redirection based method for a self-repairing memory. Unfortunately, Chen's fault signature block places address comparison with contents of the fault signature block on the critical path to the address decoders.

U.S. Pat. No. 5,577,050 to Bair et al., entitled "Method and Apparatus for Configurable Build-In Self-Repairing of ASIC Memories Design, filed Dec. 28, 1994 and issued Nov. 19, 1996 discloses a similar BISR design, wherein faulty row addresses are stored in a fault signature block and corresponding entries in an address correction block are used as substitute address for supply to a memory array. Like Chen's design, Bair's design places address comparison with contents of the fault signature block on the critical path to array addressing. Accesses to both normal and redundant addresses are necessarily delayed by (1) lookup into the substitute address table formed by fault signature and address correction blocks and (2) decode of the supplied or substituted address. Such delays can adversely affect memory access cycle times.

SUMMARY OF THE INVENTION

Accordingly, an embodiment of the present invention provides a semiconductor memory array with Built-in Self-Repair (BISR) using redundancy circuits associated with failed row address stores to drive redundant row word lines, thereby obviating supply and normal decoding of a substitute address. Instead, NOT comparator logic compares a failed row address generated and stored by BISR circuits to a row address supplied to the memory array and a TRUE comparator configured in parallel with the NOT comparator simultaneously compares defective row address signal to the supplied row address. Since NOT comparison is performed quickly in dynamic logic without setup and hold time constraints, timing impact on a normal (non-redundant) row decode path is negligible, and since TRUE comparison, though potentially slower than NOT comparison, itself identifies a particular redundant row address and therefore need not employ an N-bit address-to-selected-word-line decode, redundant row addressing is rapid and does not adversely degrade performance of a self-repaired semiconductor memory array. In some embodiments, delay through NOT and TRUE comparators themselves are nearly the same; however, the redundant path is faster since the fanout thereof is much less than that of the normal predecode path which fans out to 256 word-lines. In such an embodiment, by providing redundancy handling at the predecode circuit level, rather than at a preliminary address substitution stage, access times to a BISR memory array in accordance with the present invention are improved.

Such access time improvement is particularly advantageous in a memory block access architecture in which row decode and memory accesses are both performed in one pipeline stage of an associated high speed microprocessor. In such embodiments, high clock speed can be provided without requiring a pipelined row address decode and array access stages.

In one embodiment in accordance with the present invention, a method for repairing a packaged integrated circuit chip having an on-chip test circuit and rows of memory elements including a redundant row of memory elements includes testing the memory array using the on-chip test circuit and programming a failed address register associated with the redundant row to record a failed address of one of the memory elements, if any, failing the testing. If a presented row address matches the failed address, a redundant row circuit selective for said redundant row is enabled and, otherwise, normal row decode circuits distinct from said redundant row circuits are enabled.

In another embodiment in accordance with the present invention, a semiconductor memory having an array of memory elements including redundant memory elements includes built-in self-test (BIST) circuitry, a failed address register, redundant group selection circuitry, and a NOT comparator. The BIST circuitry is operable to test, after packaging of the semiconductor memory, the memory elements and to generate first address signals indicative of a failed group of memory elements, wherein such a failed group includes at least one failed memory element. The failed address register corresponds to a redundant group of the redundant memory elements and is coupled into an addressing path of the semiconductor memory and coupled to the BIST circuitry to receive and store the first address signals. The redundant group selection circuitry includes a TRUE comparator coupled to select the redundant group when a second address corresponds to the stored first address. The NOT comparator is coupled to enable a normal row predecoder when the second address does not correspond to the stored first address.

In yet another embodiment in accordance with the present invention, a self-repairing integrated circuit chip includes an array of semiconductor memory elements including normal and redundant memory elements, built-in self-test (BIST) circuitry, a redundancy register corresponding to a redundant group of said redundant memory elements, a TRUE comparator circuit, and a NOT comparator circuit. The BIST circuitry is operable to test, after packaging of the integrated circuit chip, memory elements defined therein and to generate first address signals indicative of a failed group of the memory elements. The redundancy register is coupled into an addressing path of the memory elements and is coupled to the BIST circuitry to receive and store the first address signals. The TRUE comparator circuit is coupled to select, without address substitution, the redundant group when a second address supplied to the array corresponds to the stored first address. The NOT comparator circuit is coupled to enable address decode circuits when the second address does not correspond to the stored first address.

In still yet another embodiment in accordance with the present invention, an apparatus includes a semiconductor memory array, failed row address encoding means, built-in self-test (BIST) means, row predecoder means, redundant row selection means, NOT comparator means, and TRUE comparator means distinct from the NOT comparator means. The BIST means are operable to test, after packaging of said semiconductor memory array, memory elements defined therein and to program the failed row address encoding means with an address of a row, if any, failing the test. The row predecoder means include a first enable terminal and are coupled to at least partially decode a row address into the semiconductor memory array. The redundant row selection means includes a second enable terminal. The NOT comparator means are coupled into a row address path of the semiconductor memory and coupled to supply the first enable terminal with an enable signal if the row address mismatches a failed row address in the failed row address encoding means. The TRUE comparator means is coupled into said row address path to supply via the redundant row selection means, a decode signal selective for a redundant row if the row address matches the failed row address.

BRIEF DESCRIPTION OF THE DRAWINGS

The present invention may be better understood, and its numerous objects, features, and advantages made apparent to those skilled in the art by referencing the accompanying drawings.

FIG. 13 depicts a state table for a state machine in accordance with an embodiment of the present invention.

DESCRIPTION OF THE PREFERRED EMBODIMENT(S)

Figure 1:
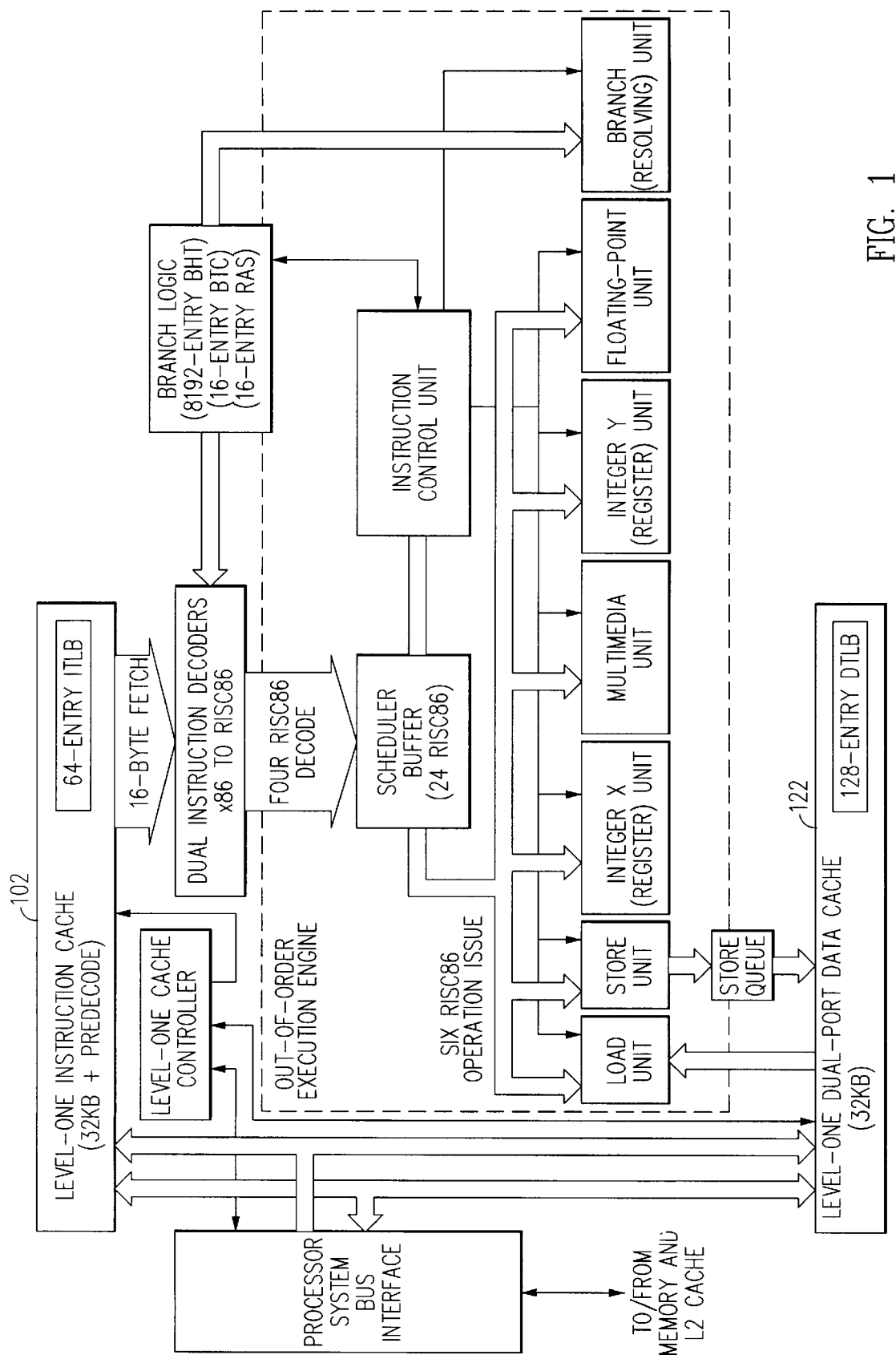
FIG. 1 is a block diagram illustrating an integrated circuit microprocessor architecture including memory arrays having Built-in Self-Repair (BISR) redundancy circuits in accordance with an embodiment of the present invention.
Figure 2:
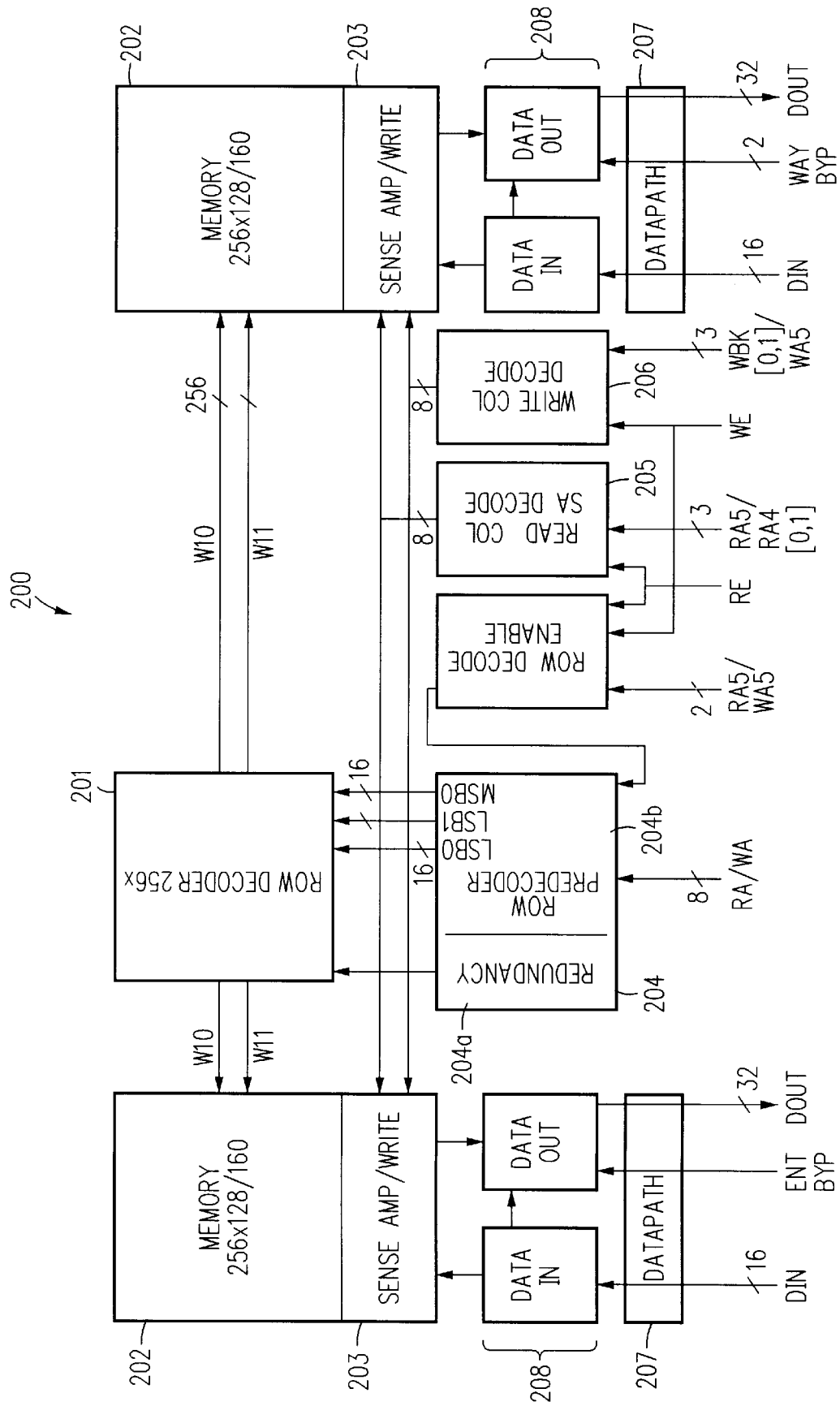
FIG. 2 is a block diagram of an 8 KB memory block for use with BISR redundancy circuits in accordance with an embodiment of the present invention and which is exemplary of component blocks of cache memory arrays of the integrated circuit microprocessor of FIG. 1.

FIG. 2 depicts data and addressing paths in an exemplary 8 KByte block of memory incorporating redundant row circuitry suitable for built-in self-test (BIST) an built-in self-repair (BISR) in accordance with an embodiment of the present invention. FIG. 1 is an architectural block diagram of a microprocessor 100 having cache memory arrays (e.g., instruction cache 102 and data cache 122) built from component 8 KByte blocks as shown in FIG. 2. A 20 KByte predecode cache based on an analogous 10 KByte block is also included in microprocessor 100. Although redundant row circuitry and BIST/BISR in accordance with the present invention is well suited for use in caches or other memory arrays of a processor such as microprocessor 100, the invention is not limited to such embodiments and, to the contrary, is more generally applicable to integrated circuits having redundant memory structures. Microprocessor 100 is described in greater detail below.

Focusing illustratively on the 8 KByte block of FIG. 2, memory block 200 includes two subarrays of memory elements organized as 256 rows by 128 columns. Each subarray includes both normal rows and two additional redundant rows of memory elements. In order to reduce power dissipation, dual word lines per row (illustratively w10 and w11) are used with a one-of-two block select for both normal and redundant rows. Either or both of these word lines can be activated dependent on wrap-around between upper and lower cache line words. Redundant row predecode 204a and normal row predecode 204b expansion circuitry supply main row decoder circuitry 201 which in turn drives selected word line(s).

Main row decoder circuitry 201, column write decode circuitry 206, sense amplifier decode circuitry 205 and data path circuits 207 use dynamic logic with keepers for delay improvement. The dynamic circuits are static held by weak keepers. Data inputs, bypass and storage buffer circuitry 208 are conventional CMOS logic. Redundant row predecode expansion circuitry 204a and normal row predecode expansion circuitry 204b are implemented in dual rail dynamic non-clocked logic.

A one per column pitch regenerative sense amplifier architecture allows for late selection by the column decode and way select after cache sensing is toleranced for offsets. Sense amplifier selects are decoded and the outputs wire-OR'ed for column selection. Way select and bypass select follow in a 2 level cascade of 2 input muxes. The wire-OR, as well as, the 2 input muxes and the output driver are dynamic logic for delay improvement. The drivers gaining up to the wide set (64×) of 2 input way select muxes are also dynamic logic.

Figure 3:
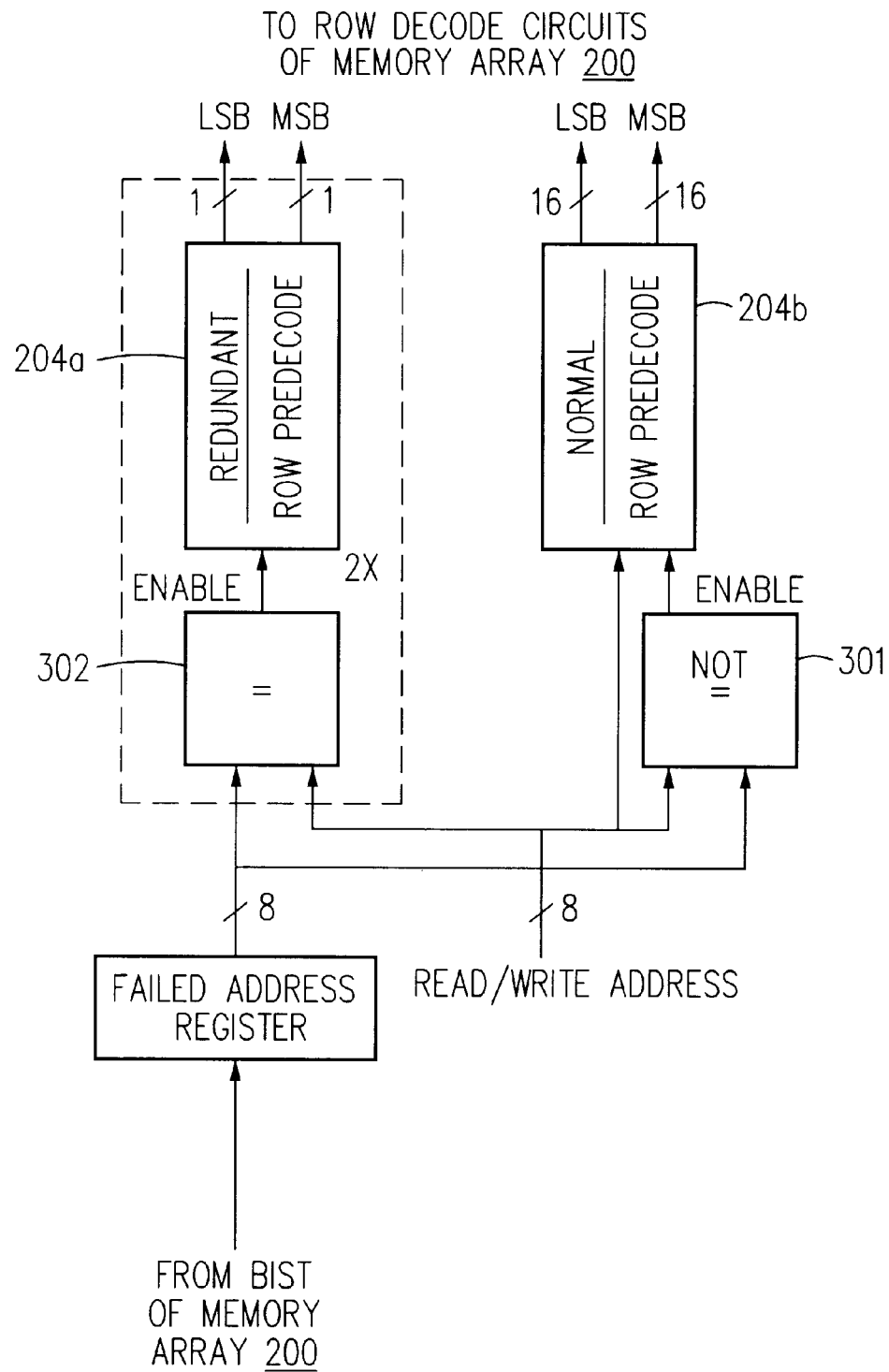
FIG. 3 is a block diagram depicting TRUE and NOT comparator circuits coupled to supply redundant and normal row predecode circuits with enable signals in accordance with an embodiment of the present invention.

An illustrative embodiment of dual, parallel and complementary comparators for selectively enabling predecode circuits (such as redundant row predecode circuit 204a and a normal row predecode circuit 204b) is shown in FIG. 3. The embodiment of FIG. 3 abstracts away support for the dual word line rows described above and focuses on support for a single redundant row. Dual comparators supply a redundant row predecode circuit 204a and a normal row predecode circuit 204b with respective enable signals. In particular, a dynamic logic NOT comparator circuit 301 compares a read or write address with a failed row address and supplies an enable signal to normal row predecode circuit 204b if the two addresses do not coincide. Similarly, TRUE comparator circuit 302 compares a read or write address with the failed row address and supplies an enable signal to redundant row predecode circuit 204a if the two addresses do coincide.

By configuring NOT comparator circuit 301 and TRUE comparator circuit 302 in parallel to enable a respective one or the other of the redundant row predecode circuit 204a and a normal row predecode circuit 204b, the redundancy logic configuration of FIG. 3 eliminates comparator-related setup and hold time constraints on timing of row addressing paths (including e.g., predecode and decode circuits) of a semiconductor memory array or subarray such as memory block 200. Only NOT comparator circuit 301 (and not TRUE comparator circuit 302) is on the signal path to enable normal row predecode circuit 204b.

Unlike a single static comparator design in which an enable signal (e.g., enable redundant row) and its complement respectively enable and disable redundant and normal row logic, the dual comparator design of FIG. 3 does not need to account for setup and hold time otherwise necessary to ensure that an enable redundant row signal and a disable normal row signal are consistent. Furthermore, particular dynamic logic implementations of NOT comparator circuit 301 can rapidly supply a normal row enable signal in response to a single bit mismatch between the read/write row address and the failed row address.

Figure 4:
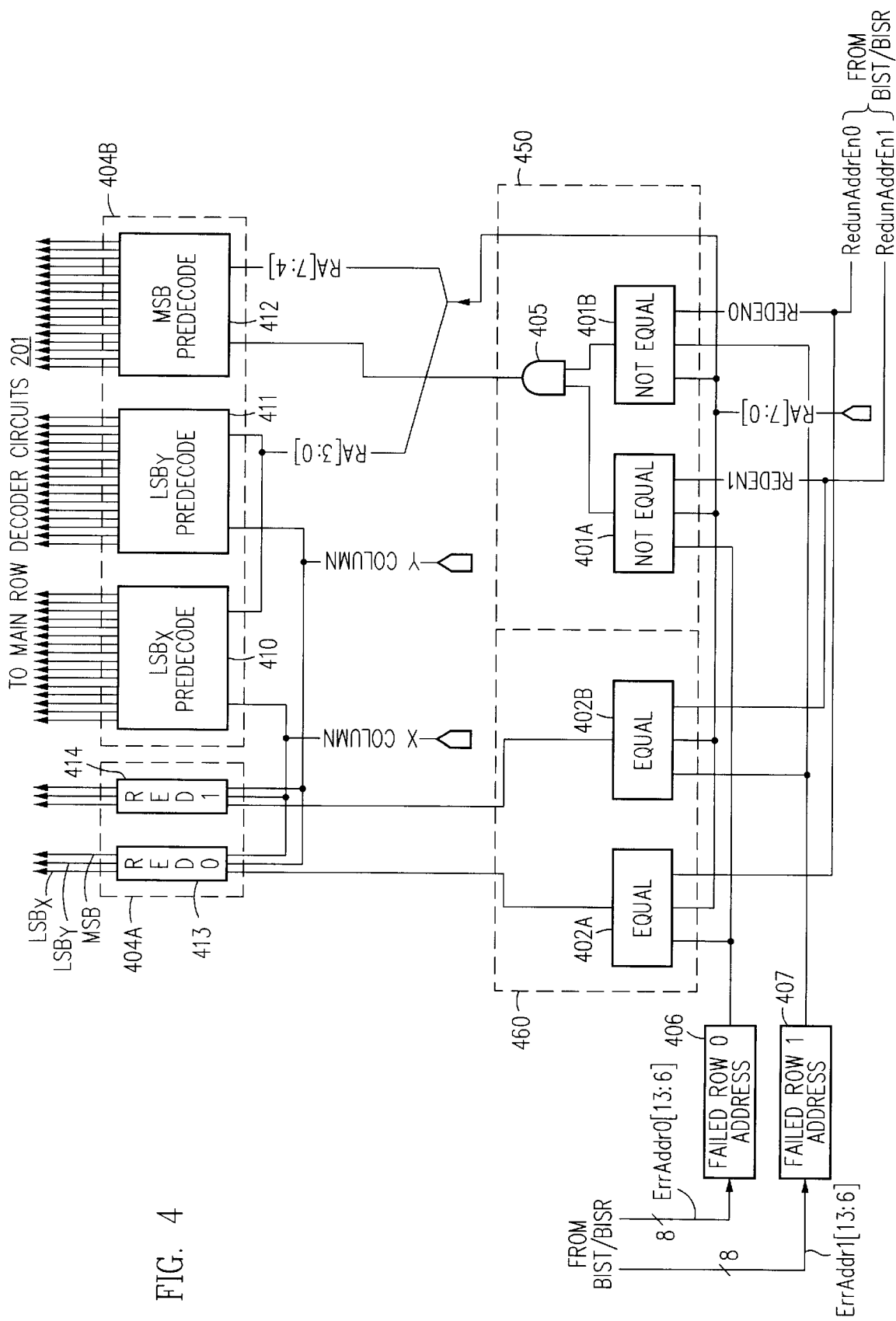
FIG. 4 is a block diagram depicting, in the context of a memory block such as that of FIG. 2, redundant row address TRUE and NOT comparator circuits coupled to supply redundant and normal row predecode circuits with respective enable signals based on contents of failed row address storage provided by BIST/BISR circuits in accordance with an embodiment of the present invention.

FIG. 4 depicts dual comparator redundancy logic supporting two redundant rows in the split word line architecture described above. Failed row address stores (e.g., failed row 0 address register 406 and failed row 1 address register 407) store addresses of up to two failed rows of memory array 202. Redundancy NOT comparators 401A and 401B compare respective failed row addresses, if any, with a read or write row address (RA[7:0]) presented to memory array 202. On a mismatch by both of the NOT comparators, the output of AND logic circuit 405 enables normal row predecoder 404B. In the embodiment of FIG. 4, normal row predecoder 404B includes least significant bit (410 and 411) and most significant bit (412) portions to supply 16-bit predecode indication to main NAND decoders of FIG. 5. X-column and Y-column portions (i.e., $LSB_X$ predecoder portion 410 and $LSB_Y$ predecoder portion 411) decode the lower order bits (RA[3:0]) of the row address presented to memory array 202 and are enabled by respective X-column and Y-column enable signals. In the particular embodiment of FIG. 4, only the most significant bit portion of normal row predecoder 404B is enabled (or not enabled) by outputs of NOT comparators 401A and 401B, although a variety of different enablings of normal row predecoder 404B are possible. Combinations of a most significant predecode bit and a least significant predecode bit are selective for particular NAND row decoder circuits of FIG. 5.

Redundancy TRUE comparators 402A and 402B also compare respective failed row addresses, if any, with a read or write row address (RA[7:0]) presented to memory array 202. On a match, the matching TRUE comparator enables a corresponding redundancy predecode circuit (e.g., redundancy predecode circuit 413 or redundancy predecode circuit 413) of redundant row predecoder 404A. Like the normal row predecoder 404B, redundant row predecoder 404A supplies a most significant predecode bit and one of two column-selected least significant predecode bits to main row decoder NAND circuits of FIG. 5. As described in greater detail below, failed address stores include volatile registers initialized by built-in self-test (BIST) circuits. In this way, failed rows of memory array 202 that are identified as failed rows either initially, during testing and bum in, or later, during the operating lifetime of memory array 202, can be repaired. In one embodiment in accordance with the present invention, BIST and BISR are performed on each power on reset of a part, such as integrated circuit microprocessor 100, incorporating the redundancy and BIST/BISR circuits described herein.

Figure 5:
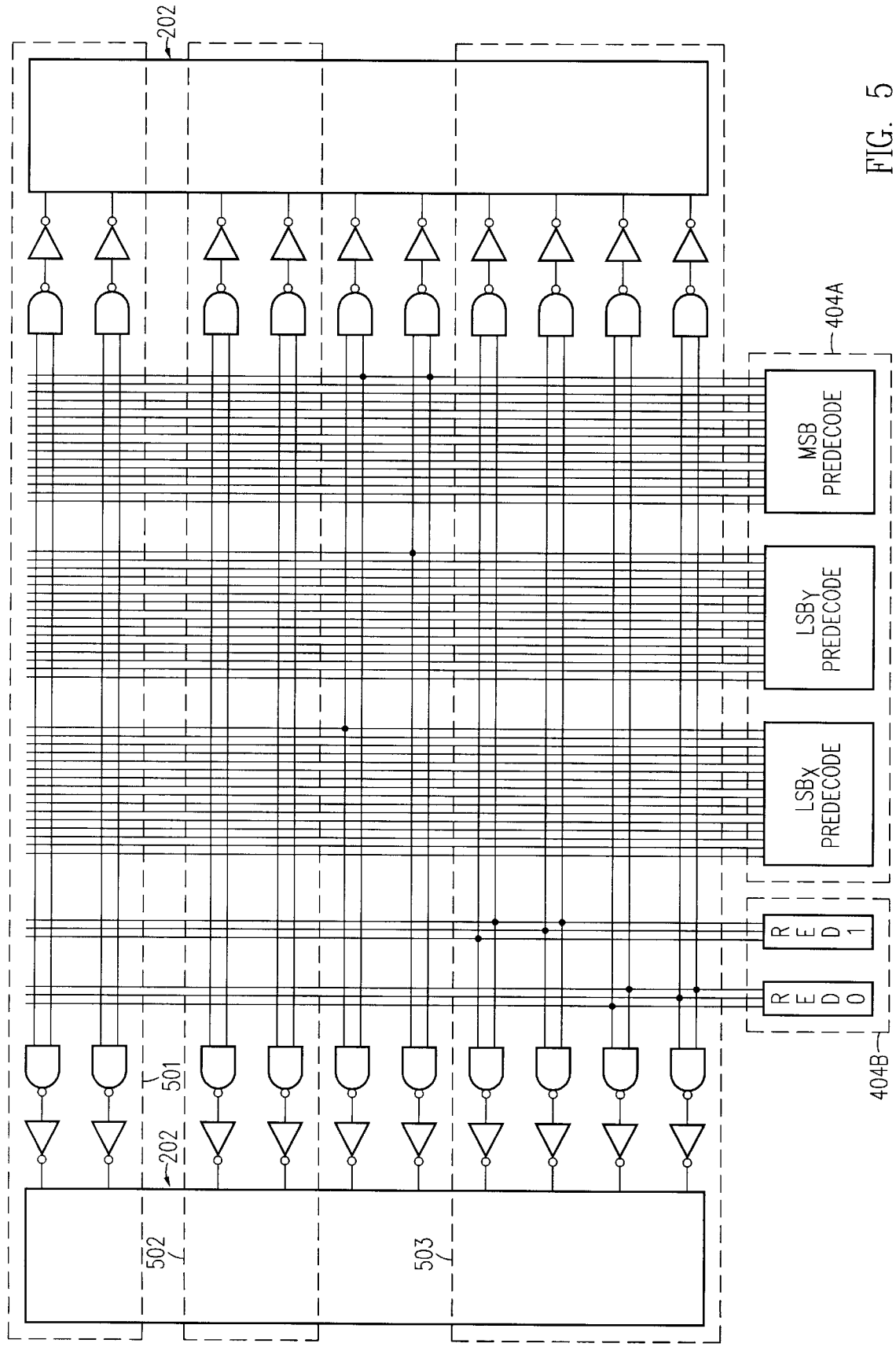
FIG. 5 is a block diagram depicting row predecode logic of FIG. 4 together with word lines, redundant word lines, main row decode logic and word line driver logic in accordance with an embodiment of the present invention.

FIG. 5 depicts a conventional main decoder stage coupled to the outputs of normal row predecoder 404B and redundant row predecoder 404A. Redundant row predecoder outputs are selective for particular row- and word-lines of redundant rows 503 of memory array 202. Similarly, normal row predecoder outputs are selective for other particular row- and word-lines of memory array 202 (illustratively, normal row 502 or 501).

Figure 6:
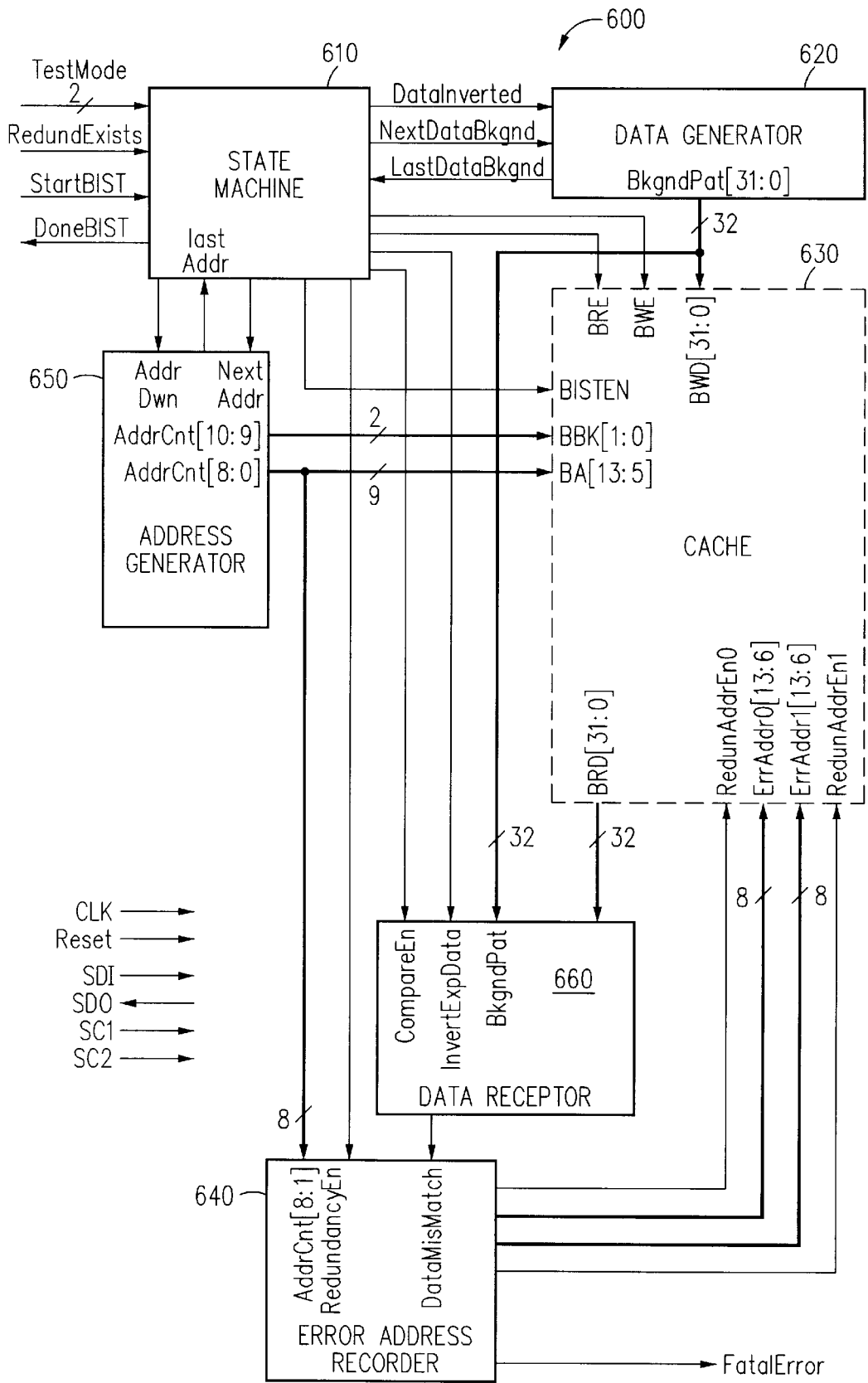
FIG. 6 is a block diagram depicting components of a BIST/BISR embodiment providing an instruction cache embodiment of a memory block such as in FIGS. 2, 4 and 5 with register based redundancy in accordance with an embodiment of the present invention.

Referring back to FIG. 4, redundant row predecoder 404A (1:1) is implemented in a single stage of dynamic logic whereas normal row predecoder 404B (1:256) is implemented in multiple stages of dynamic logic as shown in the tree structure of FIG. 6. Multiple stages, e.g., first stage (1:4) and second stage (4:16) decoder circuits, are coupled to supply a main row decoder circuit with most and least significant bits. The single stage (1:1) of redundant row predecoder 404A and multiple stages (1:4 and 4:16) of normal row predecoder 404B each include a dynamic gate, modified delayed reset circuit configuration.

Exemplary gate-level circuits for TRUE and NOT comparator logic 302 and 301 as well as for redundant row predecoder 404A and normal row predecoder 404B are described greater detail in co-pending U.S. patent application Ser. No. 08/938,950 entitled, "Dual Comparator Circuit and Method for Selecting between Normal and Redundant Row Decode Logic in a Semiconductor Memory Device," naming Dennis L. Wendell and Benjamin S. Wong as inventors and filed on even date herewith. That U.S. Patent Application is hereby incorporated herein by reference in its entirety.

BIST/BISR Overview

Dekker et al. developed a 13N BIST algorithm to test static random access memories (SRAM's), where N is the size of the address space. See Decker et al., Fault Modeling and Test Algorithm Development for Static Random Access Memories, in *Proceedings of the International Test Conference*, pp. 343–52 (November 1988). An embodiment of the present invention adapts this algorithm to implement BIST and BISR in the context of the memory block and redundancy circuits disclosed herein.

The fault model underlying the 13N algorithm tests faults in various blocks of a random access memory, including the memory array itself, address decoders and read/write logic. Defects in address decoder and read/write logic are mapped into functionally equivalent faults in the memory array. Therefore, a simple BIST controller which writes and reads as set of data patterns called data backgrounds is sufficient to detect all the possible faults that can occur during the manufacturing process. The fault model underlying the 13N algorithm has been validated by showing that spot defects such as: broken wires, shorts between wires, missing contacts, extra contacts, and newly created transistors can be detected. Specifically, faults that can be detected include:

1. stuck-at (value of memory cell cannot be changed),
2. stuck-open (a memory cell cannot be accessed),
3. transition faults (slow for 1→0 and/or 0→1 transitions), and
4. multiple access faults.

During BIST, different patterns called data backgrounds are written to the memory array and later read back to verify their correctness. The minimum number of such data backgrounds K required were derived by Abadir and Reghbati as:

$$K = \lceil \log_2 m \rceil + 1$$

where

⌈x⌉:=Smallest integer≧x, m=number of bits per word.

Log$_2$=logarithm to the base 2.

M. S. Abadir and H. K. Reghbati, Functional Testing of Semiconductor Random Access Memories, *ACM Computer Surveys*, 15(3):174–98 (September 1983). For example, for an 8-bit word we need four data backgrounds: 8'b01010101, 8'b00110011, 8'b00001111 and 8'b11111111. For each data background, the 13N algorithm is run as shown in Table 1. A march element is a finite sequence of read and/or write operations applied to every cell in the memory array, either in increasing or decreasing address order. The instructions in the test algorithm are as follows:

WD:=write the (non-inverted) data background.

RD:=Read and expect the (non-inverted) data background

WI:=write the inverted data background

RI:=Read and expect the inverted data background

First, a data background is written into all the RAM locations of a memory block such as memory block 200 (see FIG. 2) or instruction cache 630 (see FIG. 6) in the initialization phase of the algorithm. Then during each march element data is read from each address that was written in the previous march element. This is compared with the data expected and a new data is written into the same address again. For example, in march element 1 we read and expect a non-inverted data background (that was written previously in the initialization phase) and then write an inverted data background. During march elements 1 and 2, successive addresses are generated in increasing order whereas in march elements 3 and 4 addresses are in decreasing order. After march element 4, we rewind to initialization phase with a new data background.

TABLE 1

The 13N Test Algorithm

| TIME→ Address | Initialization | March Element 1 | March Element 2 | March Element 3 | March Element 4 |
|---|---|---|---|---|---|
| 0 | WD | RD, WI, RI | RI, WD, RD | RD, WI, RI | RI, WD, RD |
| 1 | WD | RD, WI, RI | RI, WD, RD | RD, WI, RI | RI, WD, RD |
| 2 | WD | RD, WI, RI | RI, WD, RD | RD, WI, RI | RI, WD, RD |
| . | . | . | . | . | . |
| N − 1 | WD | RD, WI, RI | RI, WD, RD | RD, WI, RI | RI, WD, RD |

BIST/BISR Design

FIG. 6 depicts components of a BIST/BISR design which provide a self-repairing cache 600. The self-repairing cache 600 is exemplary of instruction cache 102, data cache 122, and a predecode cache of processor 100, although embodiments in accordance with the present invention are generally well suited for the general class of integrated circuits having redundant memory structures. Cache 630 is exemplary of a memory block such as in FIGS. 2, 4 and 5 with register based redundancy in accordance with an embodiment of the present invention. Self-repairing cache 600 includes an address generator 650, a data generator 620, a data receptor 660, an error address recorder 640 and a state machine 610 to control the BIST operations and generate test and repair signals for cache 630.

Figure 7:
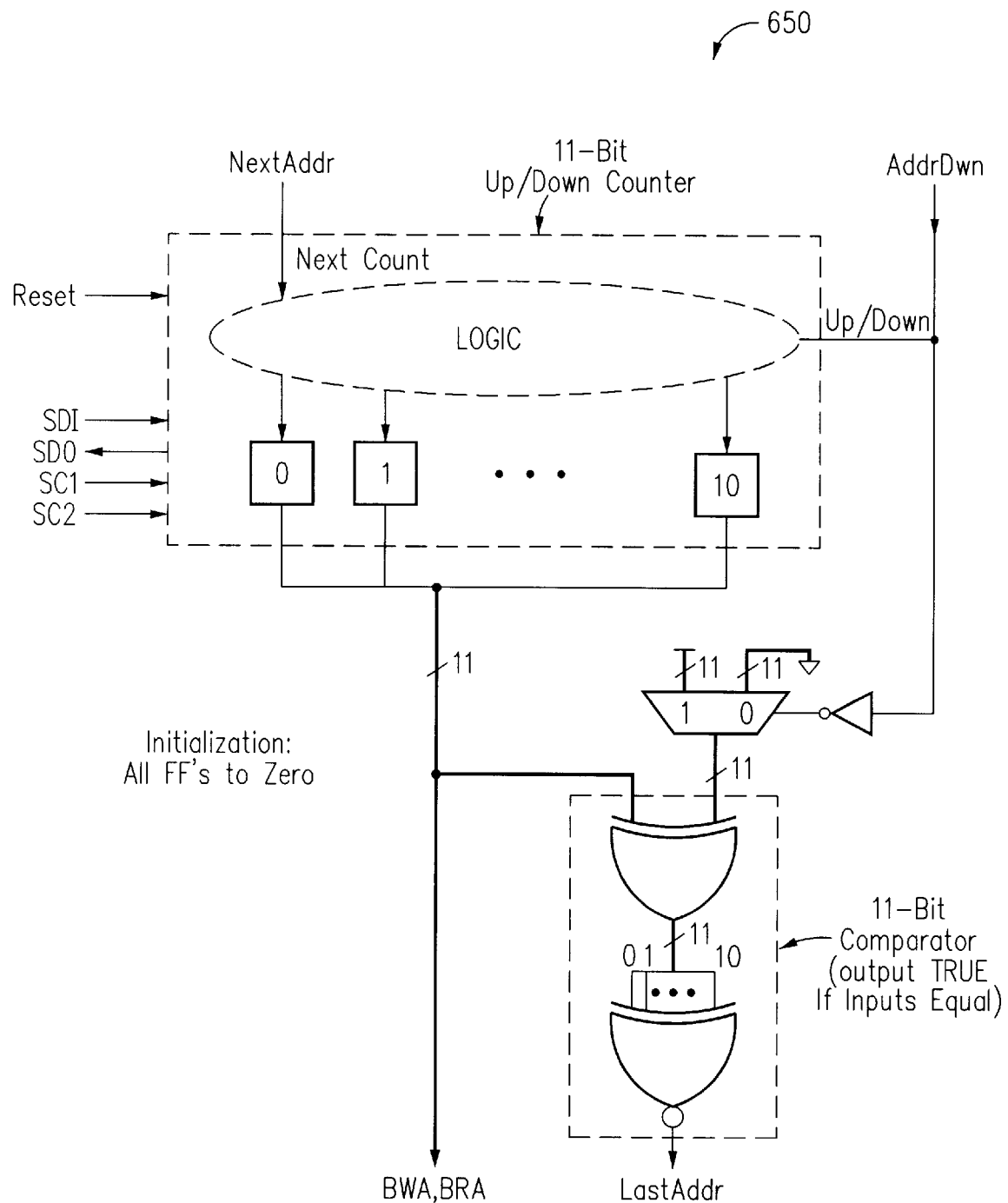
FIG. 7 depicts an address counter logic circuit suitable for generation of BIST addresses within a BIST/BISR embodiment such as that shown in FIG. 6.

Referring to FIG. 7, address counter 650 includes conventional up/down counter logic to generate addresses in a sequential order. An input NextAddr advances the counter to generate the next address. The direction of address generation is controlled by AddrDown input. A LastAddr output is generated depending upon the count direction. Other inputs/outputs are related to scan. The counter registers are initialized to zero upon Reset. For Scan BIST mode these registers are initialized using scan (See Tables 3 and 4, below).

Figure 8:
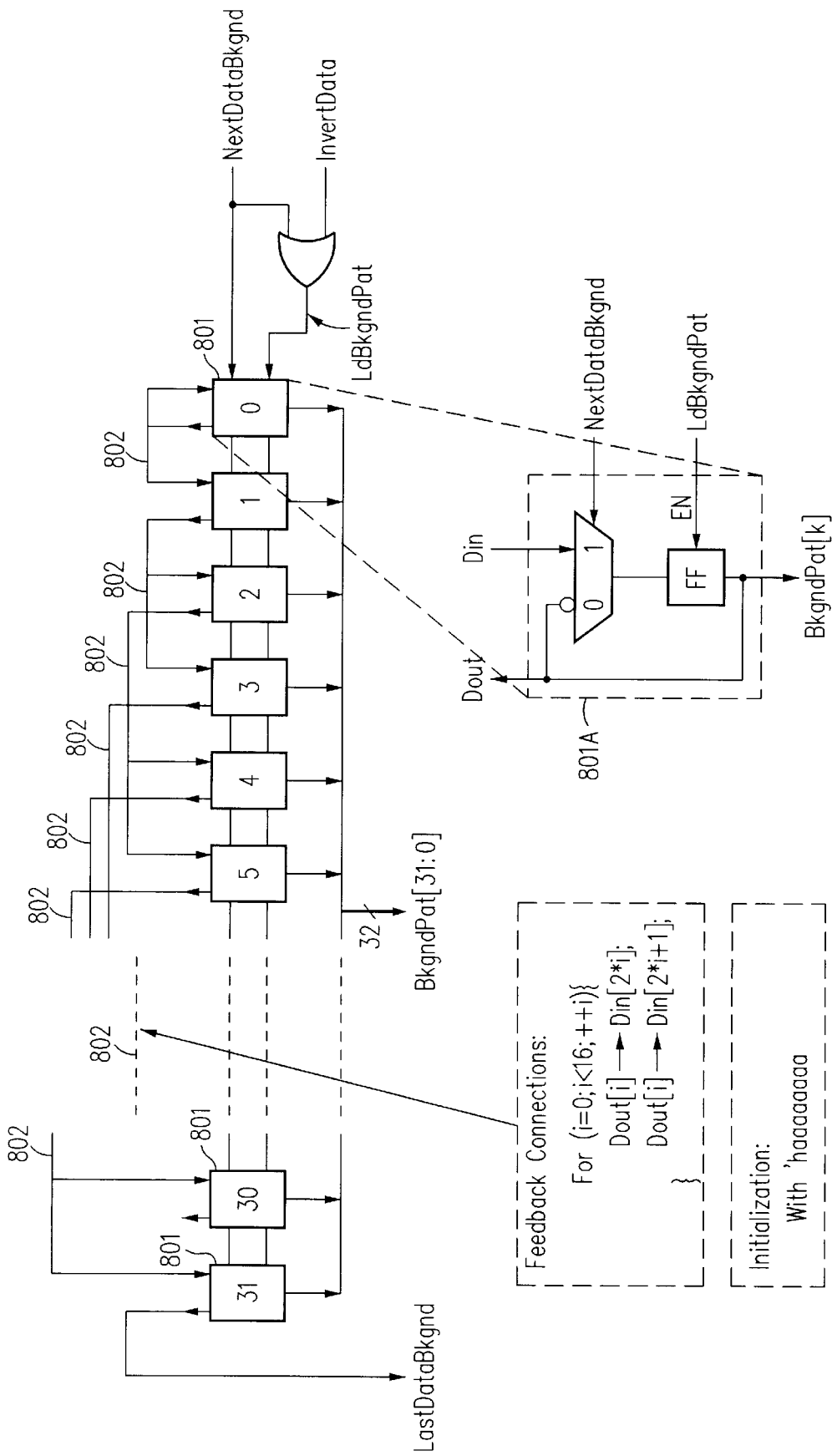
FIG. 8 is an illustrative block diagram depicting structure and operation of data generator circuit suitable for generation of various data backgrounds within a BIST/BISR embodiment such as that shown in FIG. 6.

FIG. 8 depicts a data generator 620 used to generate data backgrounds. Each cell 801 includes an 1-bit register and a 2-input MUX connected as shown in detail 801A. The InvertData input inverts the current data background. The NextDataBkgnd input generates the next data background. Feed back connections 802 between cells 801 are as shown in FIG. 8. In particular, for a given cell[i]:

$$D_{out}[i] \rightarrow D_{in}[2*i] \text{ and}$$

$$D_{out}[i] \rightarrow D_{in}[2*i+1].$$

Flip-flops of data generator 620 are initialized to 'haaaa__aaaa on Reset or before starting BIST for Scan BIST mode. This ensures that the RAM is cleared and zeros are written in all locations at the end of the test.

Figure 9:
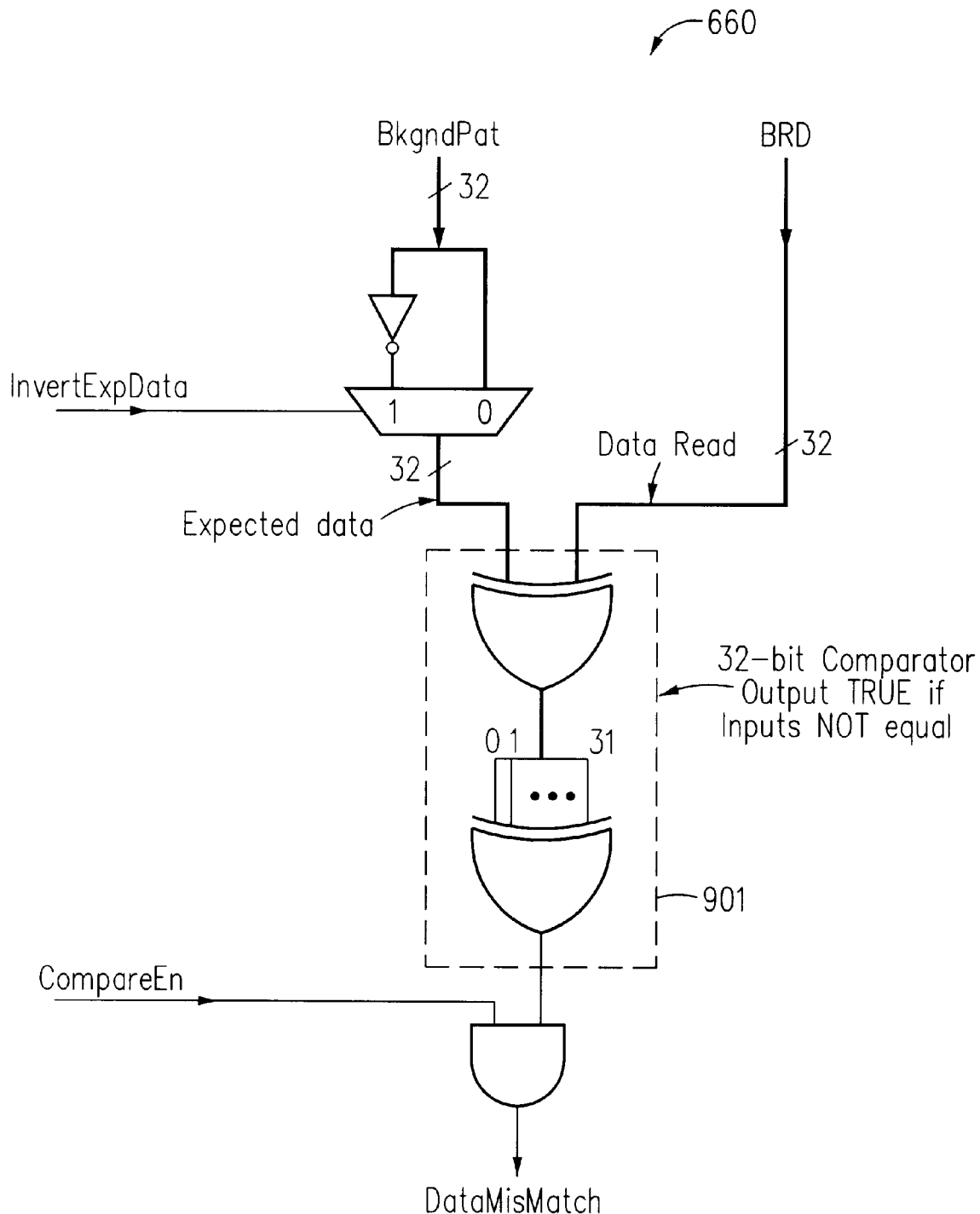
FIG. 9 depicts a data receptor logic circuit suitable for comparing BIST data read from a memory block such as that shown in FIG. 6 with expected data and generating a data mismatch signal to trigger BISR in accordance with an embodiment of the present invention.

Referring to FIG. 9, data receptor 660 includes a comparator 901 to compare the BIST data (BRD) read from the a memory block such as memory block 200 of exemplary cache 630 with ExpectedData derived from background pattern data supplied by data generator 620 to cache 630. The expected data is either the same as that generated by data generator 6 20 or an inverted version of it. The InvertExpData input controls the polarity of the expected data. The output of the comparator is HIGH if the inputs are unequal. Comparator 901 output is available to defective address recorder 640 as the DataMisMatch signal if CompareEn signal is HIGH.

Figure 10:
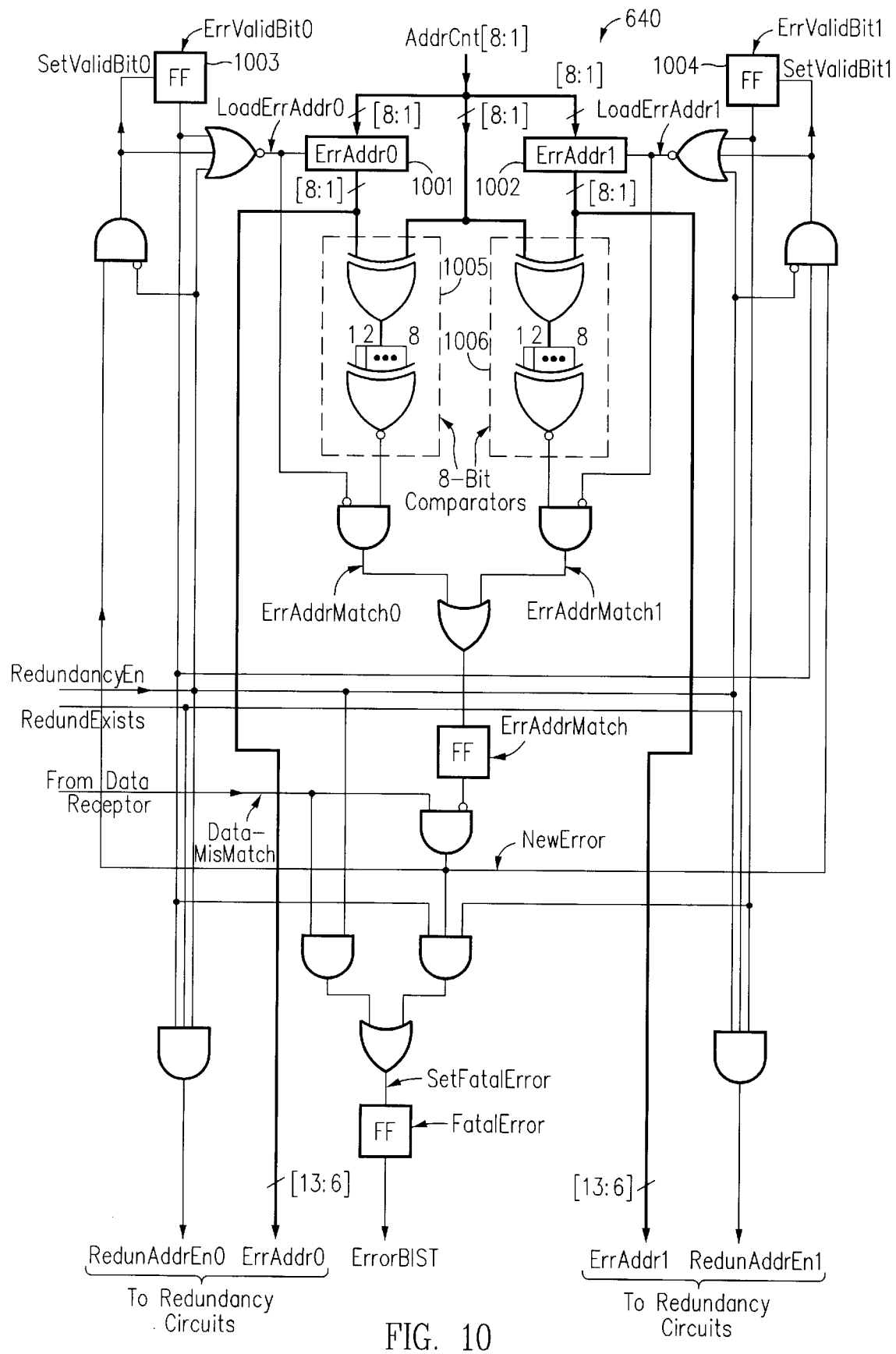
FIG. 10 depicts a defective row address decoder logic circuit suitable for comparing interfacing with failed address register, comparator and redundancy circuits such as shown in FIG. 4 to repair up to two failed rows in accordance with an embodiment of the present invention.

FIG. 10 depicts defective row address recorder 640, which, in the embodiment illustrated, includes support for two redundant groups of memory elements (e.g., rows) as illustrated in FIGS. 4 and 5. Two 8-bit error address registers 1001 and 1002 are loaded with the current row address unless their respective valid bits are set in corresponding valid flip-flops 1003 and 1004. The two comparators (1005 and 1006) compare the row addresses portion of the current address (e.g., bits [8:1] of the address counter) with that already stored the corresponding error address register (1001 or 1002). If a DataMisMatch is asserted by the data receptor 660 for this address and if this row address is not already stored in one of the error address registers (1001 or 1002) set an error address register valid bit (e.g., ErrValidBit__0 or ErrValidBit__1). If ErrValidBit__0 is already set, which means that it holds some other valid (defective) row address from a previous data mismatch, then ErrValidBit__1 is set.

In one embodiment in accordance with the present invention, state machine 610 causes the self-repairing cache 600 to make two passes through a BIST sequence. During the first pass, error address registers 1001 and 1002 and respective valid bits (ErrValidBit__0 and ErrValidBit__1) are set as described above. During a second pass through a BIST sequence, a state register RedundancyEn is set by state machine 610 to enable redundancy. The signals RedunAddrEn0 and RedunAddrEn1 are appropriately set based on error address registers 1001 and 1002 and, more particularly on respective valid bit states, enabling the memory block (illustratively cache 630) to reprogram itself by substituting the redundant rows for the defective rows indicated on the ErrAddr0 and ErrAddr1 lines. Enable signals (RedunAddrEn0 and RedunAddrEn1) are supplied to the TRUE and NOT comparators 460 and 450. On completion of the second pass through a BIST sequence, a FatalError is signalled if there are three or more errors (i.e., if there are more defective rows than can be repaired with the two redundant rows of the exemplary embodiment) in the first pass or if any error in the second pass of the BIST sequence. The second failure condition may arise if, despite repair with redundant rows, the memory block fails BIST because one of the redundant rows used for repair is itself defective.

Figure 11:
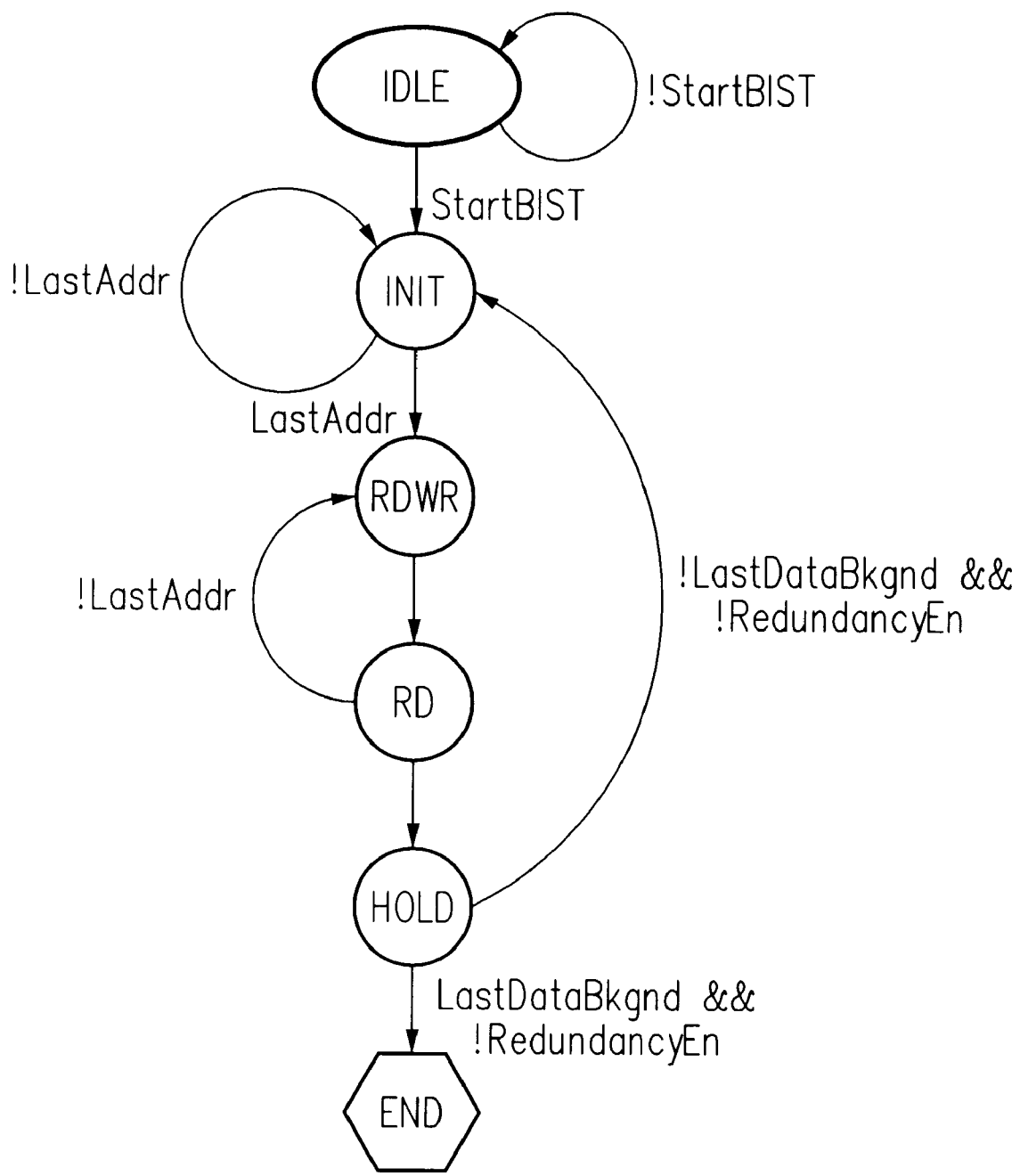
FIG. 11 is a state transition diagram for BIST/BISR control circuits in accordance with an embodiment of the present invention.

FIG. 11 shows a state transition diagram for state machine 610 of self-repairing cache 600. State machine 610 stays in the IDLE state until BIST is enabled using a StartBIST signal. In a processor 100 embodiment of self-repairing cache 600, the StartBIST signal is generated from a write-only register that is written by the reset emcode if the emcode decides to take the BIST route. Embodiments of processor 100 may or may not enable BIST/BISR. States INIT, RD__WR RD and HOLD implement the 13N algorithm described above. In the HOLD state, state machine 610 checks if the background pattern supplied is the LastDataBkgnd (last data back ground pattern). If so, the RedundancyEn register is set and a second BIST pass is executed. In either pass, if a DataMisMatch is detected then an appropriate action is taken as described above with respect to FIG. 10. Finally, the machine rests in the END state after setting a DoneBIST signal. At the end of the test, a FatalError indication indicates that self-repairing cache 600 is unable to successfully repair.

Figure 12:
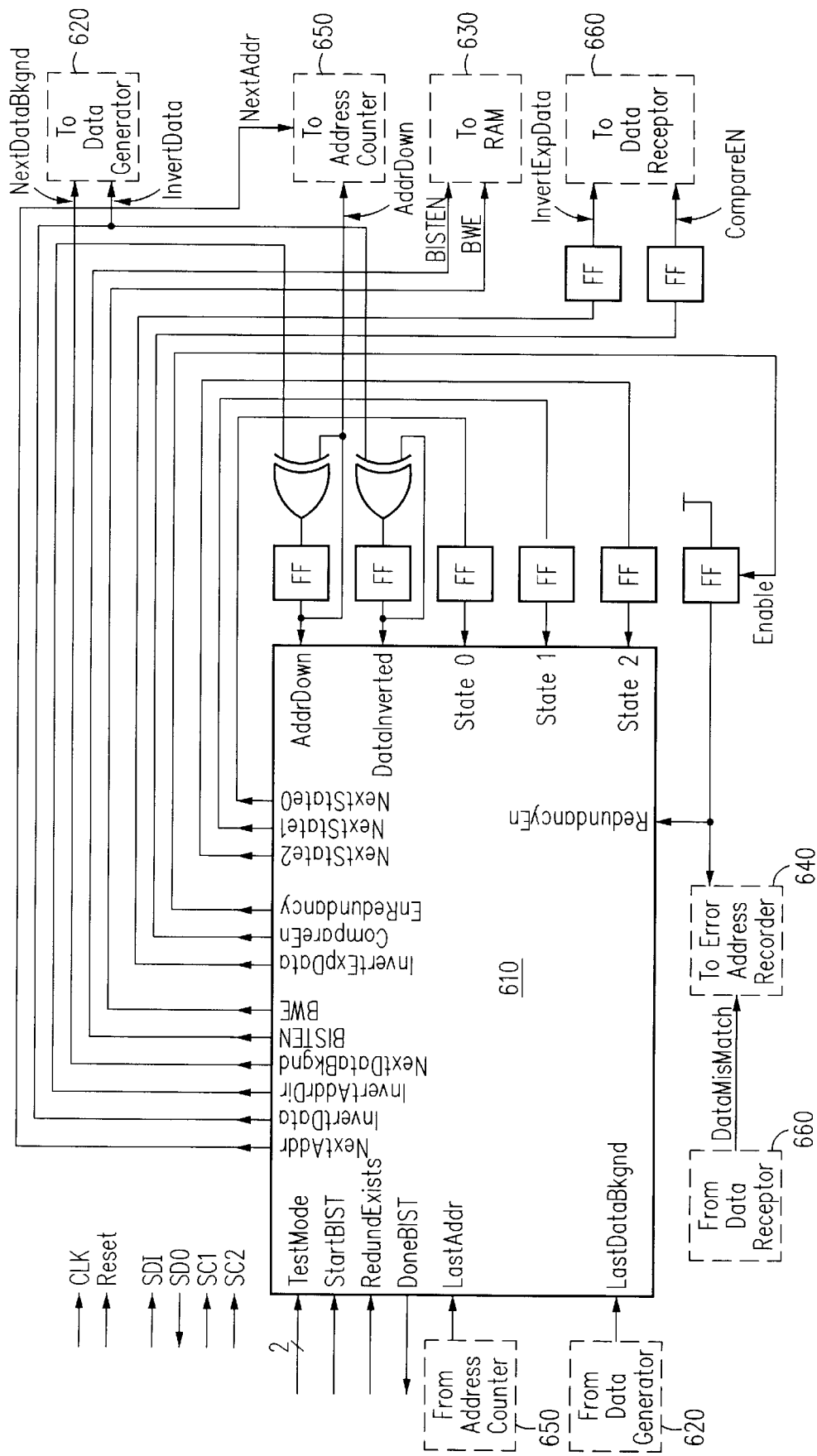
FIG. 12 is a block diagram depicting interfaces between BIST/BISR control circuits and other components of a BIST/BISR embodiment such as that shown in FIG. 6.

FIG. 12 shows the block diagram of state machine 610 and associated the input output signals thereof. State machine 610 may be implemented as a PLA, although, more preferably the BIST controller of self-repairing cache 600 is synthesized using a design compiler. FIG. 13 shows the state table for state machine 610. In an exemplary embodiment, a YES in the table corresponds to a logical 1, a NO corresponds to a logical 0, and a blank corresponds to a don't care. In this exemplary embodiment, BRE is enabled in all states.

Processor and System Embodiments

The register based redundancy circuit and method for built-in self-repair of the present invention can be used in variety of circuits and devices incorporating semiconductor memory. For example, FIG. 1 depicts an exemplary x86 instruction-set compatible integrated circuit microprocessor 100. Instructions obtained from a processor system bus interface 130 are pre-decoded during filling of a level-one (L1) instruction cache 102 after which the predecode bits are stored in a predecode cache 135. Integrated circuit microprocessor 100 decodes up to two x86 instructions per clock from instruction cache 102. Most of the x86 instructions are directly translated by hardware of dual instruction decoders 104 into one to four RISC-like operations, called RISC86 Ops. Other complex or uncommon instructions are mapped into ROM-resident sequences of RISC Ops using emulation code ROM translation. An instruction scheduler 106 buffers up to 24 RISC86 operations, using register renaming with a total of 48 registers. Up to six RISC86 operations are issued out-of-order to seven parallel execution units, illustratively load unit 108, store unit 110, integer X unit 112, multimedia unit 114, integer Y unit 116, floating point unit 118, and branch unit 120. RISC86 instructions are speculatively executed and retired in order. Microprocessor 100 also includes level-one (L1) dual-port data cache 122.

Data, instruction and predecode cache sizes are 32 KB, 32 KB and 20 KB, respectively, constructed from macro building blocks of 8 KB and 10 KB. Time multiplexing allows 1 read and 1 write per cycle. A 4×64 bit write eviction buffer is included in each data cache macro. The predecode macro includes the first stage of instruction decode logic. Bypass and storage buffer for data, instruction and predecode are provided of size 4×16, 4×16 and 2×40 bits, respectively, allowing data-in to flow back to the cache outputs. Table 1 details attributes of the caches.

In the embodiment of FIG. 1, both instruction cache 102 and data cache 122 exhibit the following basic features: 32 KB size; 2-way set associativity; 64-byte line size with 32-byte sub-blocking; cache fills on a subblock basis; virtual indexing (only bits [13:12] of the index address are virtual) and physical tagging. Synonyms/aliasing are handled in hardware; hit under miss is supported, and mutual exclusion as between instruction cache 102 and data cache 122 is supported. This eases the handling of self modifying code. To clarify the terminology: There are 256 sets in each cache. Each set contains two-ways (or lines) and each line contains two sub-blocks. The result is a 256×2×64, or 32 KB cache.

A level-one cache controller 140 controls caching in instruction cache 102. Instruction cache 102 uses a most recently used scheme (MRU) to predict the way selection on cache accesses. A misprediction in the way selection causes a one cycle penalty. Instruction cache 102 uses a least recently used (LRU) line replacement algorithm. An alternative random replacement algorithm is supported through a configuration bit. Instruction cache 102 also supports a direct-mapped replacement algorithm, although using the configuration reduces the cache size from 32 KB to 16 KB. Instruction cache 102 performs a simple prefetching algorithm. When a line miss occurs, as distinguished from a sub-block miss, and the miss is on sub-block 0 of the line (bit [5] of the address is 0), then both sub-blocks are fetched and pipelined on the bus.

The data cache 122 includes a 128-entry data translation lookahead buffer (DTLB). In contrast to instruction cache 102, the data cache 122 uses a least recently missed (LRM) selection technique which is generally a more accurate selection scheme than the LRU technique. In the LRM scheme, the line that first enters the cache is replaced. An alternative random replacement algorithm is also supported. The data cache 122 also supports a direct-mapped replacement algorithm, reducing the cache size from 32 KB to 16 KB.

The RISC86 Op scheduler 106, under control of an instruction control unit 150, issues up to six RISC86 operations using out-of-order issuing to seven parallel execution units. The execution units speculatively execute the RISC86 Ops to generate results. The RISC86 Op scheduler 106 retires the results in order. Branch unit 120 implements a branch prediction operation that uses two-level branch prediction based on an 8192-entry branch history table (BHT), a 16-entry branch target cache (BTC), and a 16-entry return address stack (RAS).

The dual instruction decoders 104 translate x86 instructions on-the-fly into corresponding RISC86 Ops. The RISC86 Ops are executed by an instruction core that is essentially a RISC superscalar processing or execution engine. The fetch logic fetches up to sixteen instruction bytes each cycle from instruction cache 102 and transfers the instruction bytes into an instruction buffer (not shown) preceding the dual instruction decoders 104 so that the instruction buffer is maintained at capacity. The dual instruction decoders 104 access the instruction bytes from the instruction buffer, decode up to two x86 instructions, immediately recognize and predict branches, and generate up to four RISC86 Ops. The RISC86 Ops are loaded into the unified RISC86 Op scheduler 106. The RISC86 Op scheduler 106 controls and tracks multiple aspects of RISC86 Op issue and execution.

The load unit 108 loads data via data cache 122 which receives data from an external memory (not shown) via the processor system bus interface 130. Bypass (not shown) and storage buffers (not shown) for data (4×16) to the data cache 122 are supplied to allow data-in and data flow-back to cache output terminals.

A wide variety of computer system configurations are envisioned, each embodying the above-described register based redundancy circuit and method for built-in self-repair in accordance with the present invention. For example, one such a computer system includes integrated circuit microprocessor 100 with instruction, data and predecode caches having register based redundancy circuits for built-in self-repair in accordance with the present invention, a memory subsystem (e.g., RAM), a display adapter, disk controller/adapter, various input/output interfaces and adapters, and corresponding external devices. Memory, adapters and interfaces are conventionally coupled to integrated circuit microprocessor 100 (e.g., via busses).

While the invention has been described with reference to various embodiments, it will be understood that these embodiments are illustrative and that the scope of the invention is not limited to them. Many variations, modifications, additions, and improvements of the embodiments described are possible. Structures and functionality presented as hardware in the exemplary embodiment may be implemented as software, firmware, or microcode in alternative embodiments. These and other variations, modifications, additions, and improvements may fall within the scope of the invention as defined in the claims which follow.

What is claimed is:

1. A method for repairing a packaged integrated circuit chip having an on-chip test circuit and rows of memory elements including a redundant row of memory elements, said method comprising the steps of:

testing said memory array using said on-chip test circuit;

programming said on-chip test circuit to store in a failed address register associated with said redundant row a failed address of one of said memory elements, if any, failing said testing;

if a presented row address matches said failed address, enabling a redundant row circuit selective for said redundant row; and otherwise, enabling normal row decode circuits distinct from said redundant row circuits.

2. A method for repairing a packaged integrated circuit chip, as recited in claim 1, wherein said redundant row enabling step is without translation to, and subsequent decode of, a replacement row address.

3. A method for repairing a packaged integrated circuit chip, as recited in claim 1, said method further comprising the steps of:

after said programming, retesting said memory array with said programmed failed address register, said on-chip test circuit thereby retesting said redundant row in place of a failed one of said rows corresponding to said failed address; and on a failure of said retest, signaling a fatal error; and otherwise, operating said packaged integrated circuit chip.

4. A method for repairing a packaged integrated circuit chip, as recited in claim 1, said method further comprising the step of:

repeatedly performing said testing and said programming steps throughout an operating lifetime of said packaged integrated circuit such that said packaged integrated circuit chip is robust to a later developed element failure.

5. A method as in claim 1, further comprising the steps of:

re-initiating at least a portion of said self-test by said BIST circuitry; and if said packaged integrated circuit passes said at least a portion of said self-test with said programmed failed address register, shipping said packaged integrated circuit, said shipped packaged integrated circuit operable to initiate a subsequent self-test by said BIST circuitry and to program said failed address register in response thereto.

6. A method as in claim 5, wherein said shipped packaged integrated circuit is further operable for a step of programming a second failed address register in response to detection of later failing memory elements during said subsequent self-test by said BIST circuitry.

7. A method as in claim 1, further comprising the steps of:

programming a second failed address register in response to detection of second failing address of one of said memory element;

if a presented row address matches said second failed address, enabling a redundant row circuit selective for a second redundant row; and otherwise, enabling normal row decode circuits distinct from said second redundant row circuits.

8. A method as in claim 1, further comprising the step of:

repeating said testing and said programming successive times during an operating lifetime of said packaged integrated circuit.

9. A method as in claim 1, wherein said failed address register is volatile; and wherein said testing is coincident with reset or power up of said packaged integrated circuit.

10. A method as in claim 1, wherein said failed address register is non-volatile; and wherein said packaged integrated circuit is operable to subsequently re-test said memory array using said on-chip test circuit and to subsequently re-program said failed address register based on said subsequent re-test.

11. A semiconductor memory having an array of memory elements including redundant memory elements, said semiconductor memory comprising:

built-in self-test (BIST) circuitry operable to test, after packaging of said semiconductor memory, said memory elements and to generate first address signals indicative of a failed group of said memory elements, said failed group including at least one failed memory element;

a failed address register coupled to a redundant group of said redundant memory elements, said failed address register coupled into an addressing path of said semiconductor memory and coupled to said BIST circuitry to receive and store said first address signals;

redundant group selection circuitry including a TRUE comparator coupled to select said redundant group when a second address on said addressing path corresponds to said stored first address; and a NOT comparator coupled to enable a normal row predecoder when said second address does not correspond to said stored first address.

12. A semiconductor memory, as recited in claim 11, wherein said redundant group comprises a redundant word line of redundant memory elements.

13. A semiconductor memory, as recited in claim 11, wherein said redundant group comprises a redundant row of redundant memory elements.

14. A semiconductor memory, as recited in claim 11, wherein said redundant group comprises a redundant column of redundant memory elements.

15. A semiconductor memory, as recited in claim 11, wherein said NOT and said TRUE comparator each comprise non-clocked dynamic logic.

16. A semiconductor memory, as recited in claim 11, wherein said TRUE comparator comprises static logic.

17. A semiconductor memory, as recited in claim 11, wherein said BIST circuitry is further operable to retest said array after said first address signals are stored in said failed address register such that said retest is performed with said redundant group in place of said failed group.

18. A self-repairing integrated circuit chip comprising:

an array of semiconductor memory elements including normal and redundant memory elements;

built-in self-test (BIST) circuitry operable to test, after packaging of said integrated circuit chip, memory elements defined therein and to generate first address signals indicative of a failed group of said memory elements;

a redundancy register coupled to a redundant group of said redundant memory elements, said redundancy register coupled into an addressing path of said memory elements and coupled to said BIST circuitry to receive and store said first address signals;

a TRUE comparator circuit coupled to select, without address substitution, said redundant group when a second address supplied to said array on said addressing path corresponds to said stored first address; and a NOT comparator circuit coupled to enable address decode circuits when said second address does not correspond to said stored first address.

19. A self-repairing integrated circuit chip, as recited in claim 18, wherein said integrated circuit chip comprises an integrated circuit microprocessor chip with a cache memory block defining said array of semiconductor memory elements.

20. A self-repairing integrated circuit chip, as recited in claim 18, wherein said integrated circuit chip comprises a memory chip with a memory block thereon defining said array of semiconductor memory elements.

21. A self-repairing integrated circuit chip, as recited in claim 18, coupled into a computer system having a processor, a memory and a bus coupled therebetween, said packaged integrated circuit chip including circuit s defining at least one of said processor and said memory.

22. An apparatus comprising:

a semiconductor memory array;

failed row address encoding means;

built-in self-test (BIST) means operable to test, after packaging of said semiconductor memory array, memory elements defined therein and to enter into said failed row address encoding means an address of a row, if any, failing said test;

row predecoder means coupled a row address path to at least partially decode a row address for application to said semiconductor memory array, said row predecoder means including a first enable terminal;

redundant row selection means;

NOT comparator means coupled to said row address path of said semiconductor memory and coupled to supply said first enable terminal with an enable signal when a row address mismatches a failed row address in said failed row address encoding means; and TRUE comparator means distinct from said NOT comparator means and coupled to said row address path to supply, via said redundant row selection means, a decode signal selective for a redundant row when said row address matches said failed row address.

* * * * *